Oct. 31, 1967 D. A. MOORE ET AL 3,350,577
SOLID STATE GATING CIRCUIT
Filed March 8, 1965
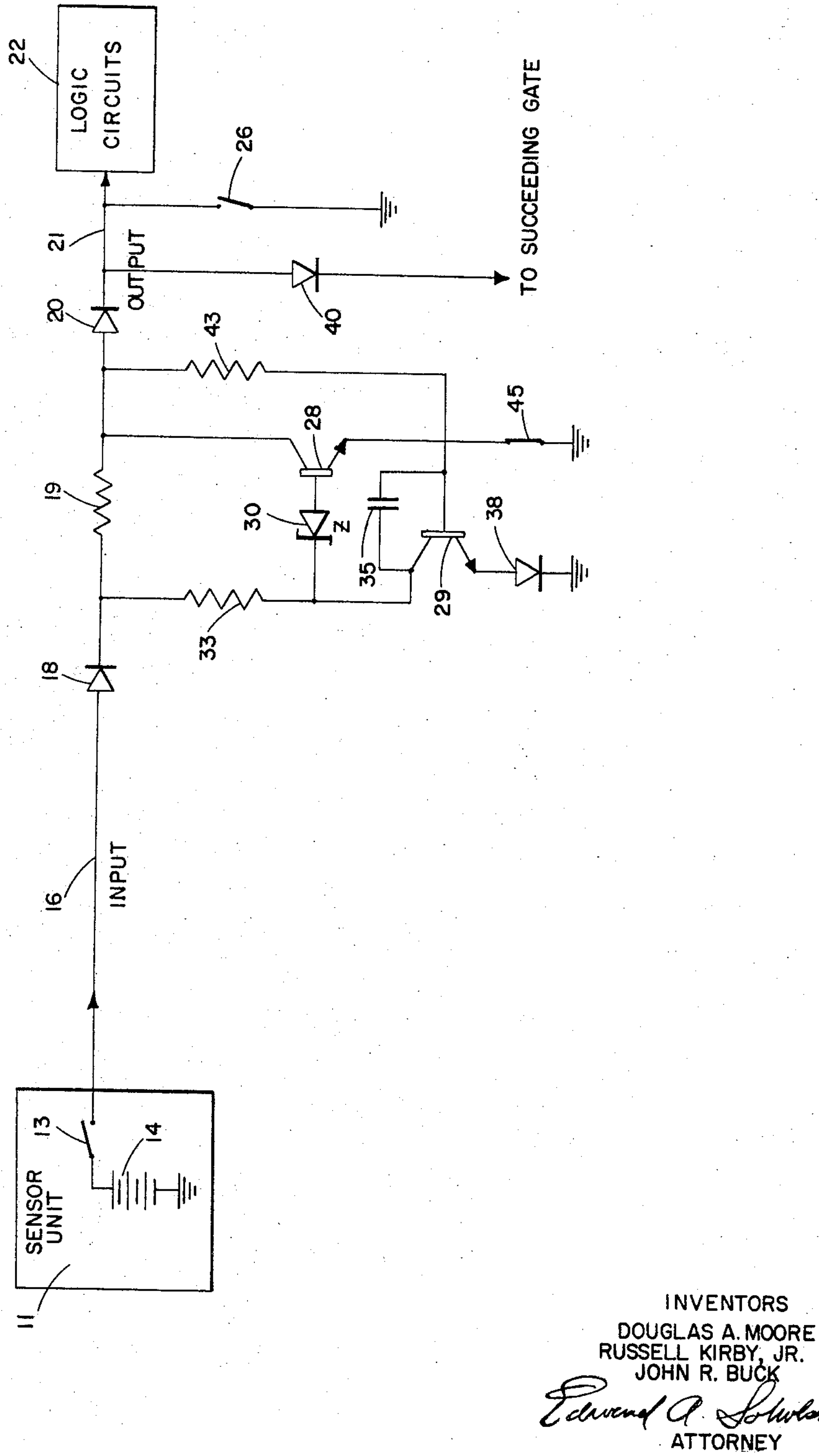
INVENTORS
DOUGLAS A. MOORE
RUSSELL KIRBY, JR.
JOHN R. BUCK
Edward A. Schwartz
ATTORNEY 3,350,577

SOLID STATE GATING CIRCUIT

Douglas A. Moore, Rolling Hills, Russell Kirby, Jr., Torrance, and John R. Buck, Gardena, Calif., assignors to Northrop Corporation, Beverly Hills, Calif., a corporation of California Filed Mar. 8, 1965, Ser. No. 437,787
11 Claims. (Cl. 307—88.5)

ABSTRACT OF THE DISCLOSURE

A pair of transistors connected in a flip-flop circuit are arranged so that in the absence of appropriate gating signals both flip-flop stages remain at cutoff, but with the arrival of an appropriate input signal, a particular one of these stages goes to conduction. A zener diode is connected between the transistors and when an override signal is generated on the circuit's output line, the zener diode is fired to cause the opposite flip-flop stage to conduct heavily. This opposite flip-flop stage is connected to the output line so as to effectively short out signals thereon when in its conductive state.

This invention relates to a solid state gating circuit and more particularly to such a circuit which responds unequivocally to a predetermined amplitude gating signal yet which is relatively insensitive to undesired triggering signals.

A gating circuit may be used to produce a predetermined output or to cut off an existing output when two signal conditions on both the input and output lines are satisfied. This type of gating is utilized, for example, in the device described in Patent No. 3,015,702, issued Jan. 2, 1962, and assigned to Northrop Corporation, the assignee of the instant application. In the audio warning system described in this patent, a plurality of signal relays operating in conjunction with semiconductor diodes are utilized to perform the gating operation. The relays in this particular application have the advantage of operating over a relatively wide range of voltage and of being relatively insensitive to short term transients. Relays, however, are relatively bulky and heavy as compared with semiconductor gating elements. Further, where space is a prime considerations, such as in airborne uses, and relays are packed closely together, the heat dissipation involved tends to lower the reliability of operation. These first two factors are of especial significance where a great number of gating elements are required as in the audio warning system of the aforementioned patent. Relays also have inherent electromechanical failure problems. For these reasons, semiconductor circuitry appears to be preferable to relays.

Semiconductor switching circuits of the prior art, however, tend to be highly regenerative and switch very quickly. With such circuits it is therefore difficult to prevent undesired triggering unless adjacent and connecting lines such as power lines, input lines, output lines and trigger lines are carefully filtered or regulated to prevent undesired transients from getting into the circuit. The elimination of the effects of such transient pulses, in the gating circuits of the prior art, often poses a difficult design problem and the addition of a considerable number of circuit components especially where a great many gating circuits are involved. For this reason, despite the many advantages to be gained from the substitution of semiconductor units for relays, in many applications where severe transient problems are encountered, the only feasible approach appears to lie in the use of relays.

The solid state gating circuit of this invention substantially eliminates the effects of transient pulses and provides highly reliable gating operation over a wide range of operating conditions. This end result is achieved without utilizing relay components and thus eliminates the disadvantages incidental thereto.

Improvement is achieved in the device of the invention by utilizing a pair of transistors in a flop-flop circuit, this circuit being arranged so that in the absence of appropriate gating signals both stages of the flip-flop remain at cutoff, and with actuation by a predetermined gating signal, one of these stages will always go to conduction. The means for causing the one transistor stage to always go to conduction also serves to provide a relatively long time constant delay, making the gating circuit substantially insensitive to transient pulses which are of relatively short duration.

It is therefore an object of this invention to provide an improved solid state gating circuit.

It is a further object of this invention to provide a solid state gating circuit which is substantially insensitive to transient pulses.

It is still a further object of this invention to enable the substitution of solid state components for relays without sacrificing noise immunity characteristics.

It is still another object of this invention to provide a gating circuit which operates to provide a control signal when predetermined signals appear simultaneously on the input and output lines thereof.

It is still a further object of this invention to provide a gating circuit of relatively economical construction which provides highly reliable operation.

Other objects of this invention will become apparent from the following description taken in connection with the accompanying drawing.

The figure is a schematic drawing of a preferred embodiment of the device of the invention.

Referring to the figure, sensor unit 11 includes a switch 13 and D-C power source 14. Sensor unit 11 may, for example, comprise a monitoring unit which senses a failure in a particular piece of equipment, such that when such a failure occurs, switch 13 closes to supply a D-C voltage to line 16. When such a sensed condition causes switch 13 to close, a positive signal is fed through diode 18, resistor 19 and diode 20, to output line 21. This signal may be fed to appropriate logic circuits 22 where the information is utilized in appropriate manner, for example, to provide a warning message under a predetermined priority schedule. As described in the aforementioned Patent No. 3,015,702, a plurality of such sensor units may be utilized, each to sense a particular malfunction, with all of these signals being fed to appropriate logic circuits 22 where the information is properly correlated and used to institute an appropriate audio warning message.

With override switch 26 open, the input signal on line 16 from sensor unit 13 provides base current to transistor 29 which drives this transistor to saturation. With transistor 29 conducting, the cathode of zener diode 30 is maintained near ground level and hence the zener diode is kept cut off. Transistor 28 therefore has a "floating" base and is also kept cut off.

It is to be noted that short duration transient pulses on line 16 will not cause transistor 29 to be driven to conduction in view of the relatively long time constant provided by virtue of the Miller integration effect achieved by means of capacitor 35 which is connected between the base and collector of transistor 29. Such a Miller integrator circuit as is well-known in the art provides an effective time constant at the input of the transistor which is a function of the resistance of resistor 33 times the capacitance of capacitor 35 times the gain of transistor 29. Thus, a relatively long time constant can be achieved with relatively small values for capacitor 35 and resistor 33 by virtue of the gain characteristics of the transistor. This delay effect thus makes the circuit substantially intensitive to short duration pulses such as transients and the like.

Diode 38, which is connected between the emitter of transistor 29 and ground is utilized to provide a small amount of back bias on the transistor to further improve the reliability of operation thereof.

With switch 13 closed to provide an input voltage on line 16, transistor 29 as noted will conduct heavily. Such conduction will unequivocally maintain transistor 28 at cutoff in view of the fact that the cathode of zener diode 30 is thereby maintained at close to ground potential by virtue of the conduction of transistor 29. Under such conditions, an output signal is provided on line 21 to logic circuits 22 and through diode 40 to a succeeding gate output.

Let us now assume that it is desired to override the input signal provided from sensor unit 11 so that it no longer has any effect on logic circuits 22. This can be accomplished by closing switch 26 for a short period of time. With such closing of switch 26, a ground level pulse is fed through diode 20 to the base of transistor 29 driving this transistor to cutoff. When transistor 29 is driven to cutoff, the voltage at its collector immediately rises, providing a voltage at the cathode of zener diode 30 which is sufficient to cause this diode to conduct. With the conduction of zener diode 30, transistor 28 is driven to a conductive state in a saturation condition. With transistor 28 conducting, the base voltage supplied to transistor 29 through resistor 43 is brought to near ground potential so as to maintain transistor 29 at cutoff.

The saturation conduction of transistor 28 brings the voltage on output line 21 to close to ground potential. Thus, the input from this line to logic circuits 22 and to the succeeding gates is eliminated. In this fashion, when the dual conditions of a predetermined positive input on line 16 and a pulse having greater than a predetermined amplitude and duration on line 21 appear simultaneously, all output on line 21 is eliminated. It is to be noted that short-duration, transient type pulses that may appear on line 21 while there is simultaneously a positive input signal on line 16 will not cause transistor 29 to be driven to cutoff, this by virtue of the time delay provided by the Miller integrator, including capacitor 35. The effective time constant of the Miller integrating circuit is designed so that it will eliminate the effects of transient pulses, yet at the same time will respond to the longer pulses produced with the short duration closing of switch 26.

Transistor 28 will continue to conduct, thereby effectively overriding the output on line 21 until reset is accomplished by opening switch 45 momentarily. Such "resetting" will also be accomplished, of course, with the termination of the input signal on line 16 when switch 13 opens.

A significant feature of this circuit to be noted is that both transistors 28 and 29 remain at cutoff until sensor unit 11 produces a signal on line 16. Thus, power dissipation is kept at a minimum. Further, transistor 29 will always go to conduction when switch 13 is closed prior to the closing of override switch 26. With the closing of switch 26, however, a flip-over occurs to bring transistor 28 into conduction, and the circuit remains in this state until a reset signal is introduced. Further, substantial insensitivity to transient pulses is attained by use of a Miller integrator circuit in the triggering circuit of transistor 29.

The device of this invention thus provides a simple yet yet highly effective gating circuit substantially insensitive to transient pulses which is suitable for use in eliminating an output signal when a short duration actuating signal is imposed on the output line.

While the circuit of this invention has been described and illustrated in detail, it is to be clearly understood that this is intended by way of illustration and example only and is not to be taken by way of limitation, the spirit and scope of this invention being determined solely by the terms of the following claims.

We claim:

1. In a solid state gating circuit,
an input line,
means for selectively providing a D-C input to said input line,
an output line,
means for selectively providing a signal to said output line,
means for coupling said D-C input from said input line to said output line,
first and second transistors connected together in a flip-flop configuration, said transistors each having emitter, collector and base electrodes,
a zener diode connected between the collector electrode of said first transistor and the base electrode of said second transistor,
said transistors both being non-conductive in the absence af said D-C input,
means for responsively connecting the base of electrode of said first transistor both to said input line and said output line, and
integrator means connected in circuit with said first transistor,
whereby said D-C input is removed from said output line when said signal is selectively provided on said output line.

2. The circuit as recited in claim 1 wherein said integrator means comprises a capacitor connected between the base and collector electrodes of said first transistor.

3. The circuit as recited in claim 1 wherein said means for coupling said D-C input to said output line comprises a first and second diode connected in series, the anode of said first diode being connected to said input line, the cathode of said second diode being connected to said output line.

4. The circuit as recited in claim 3 wherein said means for connecting the base electrode of said first transistor to said input and output lines includes a resistor connected between said first transistor base electrode and the anode of said second diode.

5. In a solid state gating circuit,
an input line,
means for selectively providing a D-C input to said input line,
an output line,
means for selectively providing a signal to said output line,
unidirectional current means for coupling said D-C input from said input line to said output line,
first and second transistors each having a base, a collector and an emitter, and connected together in a flip-flop configuration,
a zener diode connected between the collector of said first transistor and the base of said second transistor,
said transistors both being non-conductive in the absence of said D-C input,
means for responsively connecting the base of said first transistor both to said input line and said output line,
whereby said D-C input is removed from said output line when said signal is selectively provided on said output line.

6. The circuit as recited in claim 5 wherein said D-C input comprises a positive potential with respect to ground potential and said signal is at ground potential.

7. The circuit as recited in claim 5 and additionally including integrator means connected to said first transistor to prevent said first transistor from being actuated by short duration pulses.

8. A gating circuit comprising
means for selectively producing a D-C control signal having a positive potential,
an output line,
first and second series connected unidirectional current means for coupling said D-C signal to said output line,
means for selectively producing a ground potential signal, and
means for eliminating said D-C control signal from said output line in response to said signal comprising
first and second transistors each having an emitter, a base and a collector and connected in a flip-flop circuit,
means for connecting the base of said first transistor between said first and second unidirectional current means whereby said transistor is brought to the conductive state by said D-C control signal,
zener diode means connected between the collector of said first transistor and the base of said second transistor for preventing said second transistor from being driven to conduction while said first transistor is conducting,
capacitor means connected in circuit with said first transistor to cause Miller integration therein to prevent said first transistor from being affected by transient pulses, and
means for coupling said selectively produced signal to said output line,
whereby when said signal is coupled to the base of said first transistor, said first transistor is driven to cutoff thereby causing said zener diode to conduct to drive said second transistor to conduction.

9. The circuit as recited in claim 8 and additionally including reset switch means for momentarily bringing said second transistor to cutoff.

10. A gating circuit comprising means for selectively producting a D-C control signal,
an input line, said D-C control signal being fed to said input line,
an output line,
means for coupling said input line to said output line,
means for selectively producing an override signal, and
means for eliminating said D-C control signal from said output line in response to said override signal comprising
first and second transistors each having a base, collector and emitter and connected in a flip-flop circuit,
means for connecting the base of said first transistor to said input and output lines whereby said first transistor is brought to the conductive state by said D-C control signal,
bias means connected between the collector of said first transistor and the base of said second transistor for preventing said second transistor from being driven to conduction while said first transistor is conducting,
integrator means connected in circuit with said first transistor to prevent said first transistor from being affected by short duration pulses, and
means for coupling said selectively produced override signal to said output line,
whereby when said override signal is coupled to the base of said first transistor, said first transistor is driven to cutoff thereby causing said second transistor to go to conduction.

11. The circuit as recited in claim 10 wherein said D-C control signal has a positive potential with respect to ground and said override signal is at ground potential.

No references cited.

ARTHUR GAUSS, *Primary Examiner.*

J. ZAZWORSKY, *Assistant Examiner.*